US 6,738,236 B1

(12) United States Patent
Mao et al.

(10) Patent No.: US 6,738,236 B1
(45) Date of Patent: May 18, 2004

(54) SPIN VALVE/GMR SENSOR USING SYNTHETIC ANTIFERROMAGNETIC LAYER PINNED BY MN-ALLOY HAVING A HIGH BLOCKING TEMPERATURE

(75) Inventors: Sining Mao, Savage, MN (US); Anthony M. Mack, Minneapolis, MN (US); Brenda A. Everitt, Minneapolis, MN (US); Edward S. Murdock, Edina, MN (US); Zheng Gao, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 593 days.

(21) Appl. No.: 09/306,484

(22) Filed: May 6, 1999

Related U.S. Application Data
(60) Provisional application No. 60/084,626, filed on May 7, 1998.

(51) Int. Cl.[7] .................................................. G11B 5/39
(52) U.S. Cl. ................................................. 360/324.11
(58) Field of Search ................................. 360/313, 314, 360/324, 324.1, 324.11, 324.12; 428/692

(56) References Cited

U.S. PATENT DOCUMENTS

| | | | |
|---|---|---|---|
| 4,949,039 A | 8/1990 | Grunberg | 324/252 |
| 5,206,590 A | 4/1993 | Dieny et al. | 324/252 |
| 5,475,304 A | 12/1995 | Prinz | 324/207.21 |
| 5,534,355 A | 7/1996 | Okuno et al. | 428/611 |
| 5,576,915 A | 11/1996 | Akiyama et al. | 360/113 |
| 5,583,725 A | * 12/1996 | Coffey et al. | 360/113 |
| 5,616,370 A | 4/1997 | Okuno et al. | 427/547 |
| 5,650,887 A | 7/1997 | Dovek et al. | 360/75 |
| 5,686,838 A | 11/1997 | van den Berg | 324/252 |
| 5,688,605 A | 11/1997 | Iwasaki et al. | 428/611 |
| 5,696,655 A | 12/1997 | Kawano et al. | 360/113 |
| 5,696,656 A | 12/1997 | Gill et al. | 360/113 |
| 5,701,223 A | * 12/1997 | Fontana, Jr. et al. | 360/113 |
| 5,702,832 A | 12/1997 | Iwasaki et al. | 428/611 |
| 5,705,973 A | 1/1998 | Yuan et al. | 338/32 R |
| 5,717,550 A | 2/1998 | Nepela et al. | 360/113 |
| 5,725,963 A | 3/1998 | Iwasaki et al. | 428/611 |
| 5,738,946 A | 4/1998 | Iwasaki et al. | 428/611 |
| 5,739,988 A | 4/1998 | Gill | 360/113 |
| 5,739,990 A | 4/1998 | Ravipati et al. | 360/113 |

(List continued on next page.)

OTHER PUBLICATIONS

"Linearity of Unshielded Spin–Valve Sensors", by N. Sugaware et al., American Institute of Physics, Jan. 27, 1997, pp. 523–525.
"AMR Effect in Spin–Valve Structure", by Y. Uehara et al., IEEE Transactions on Magnetics, vol. 32, No. 5, Sep. 1996, pp. 3432–3433.
"Thermal Fluctuation Aftereffect of Exchange Coupled Films for Spin Valve Devices", by J. Fujikata, K. Hayashi, H. Yamamoto and M. Nakada, J. Appl. Phys. vol. 83, No. 11, Jun. 1, 1998, American Institute of Physics, pp. 7210–7212.
"NiMn–Pinned Spin Valves with High Pinning Field Made by Ion Beam Sputtering", by S. Mao, S. Gangopadhyay, N. Amin and E. Murdock, Appl. Phys. Lett., vol. 69, No. 23, Dec. 2, 1996, American Institute of Physics, pp. 3593–3595.
"Temperature Dependence of Giant Magnetoresistance Properties of NiMn Pinned Spin Valves", by S. Mao, N. Amin and E. Murdock, Appl. Phys., vol. 83, No. 11, Jun. 1, 1998, American Institute of Physics, pp. 6807–6809.

*Primary Examiner*—Tianjie Chen
(74) *Attorney, Agent, or Firm*—Westman, Champlin & Kelly, P.A.

(57) ABSTRACT

Disclosed are a spin valve magnetoresistive sensor and methods of fabricating the same. The sensor includes a free layer, a synthetic antiferromagnetic. (SAF) layer, a spacer layer positioned between the free layer and the SAF layer, and a Mn-based antiferromagnetic pinning layer in contact with the SAF layer. The SAF layer includes first and second ferromagnetic CoFe layers and an Ru spacer layer positioned between and directly in contact with the first and second CoFe ferromagnetic layers.

11 Claims, 7 Drawing Sheets

U.S. PATENT DOCUMENTS

| | | | |
|---|---|---|---|
| 5,742,162 A | 4/1998 | Nepela et al. | 324/252 |
| 5,751,521 A | 5/1998 | Gill | 360/113 |
| 5,756,191 A | 5/1998 | Hashimoto et al. | 428/209 |
| 5,764,056 A | 6/1998 | Mao et al. | 324/252 |
| 5,768,066 A | 6/1998 | Akiyama et al. | 360/113 |
| 5,768,069 A | 6/1998 | Mauri | 360/113 |
| 5,880,913 A | 3/1999 | Gill | 360/112 |
| 5,883,764 A | 3/1999 | Pinarbasi | 360/113 |
| 5,976,713 A * | 11/1999 | Fuke et al. | 428/692 |
| 6,061,210 A * | 5/2000 | Gill | 360/113 |
| 6,088,195 A * | 7/2000 | Kamiguchi et al. | 360/113 |
| 6,094,325 A * | 7/2000 | Tagawa et al. | 360/113 |
| 6,101,072 A * | 8/2000 | Hayashi | 360/324 |

* cited by examiner

SPIN VALVE/GMR SENSOR USING SYNTHETIC ANTIFERROMAGNETIC LAYER PINNED BY MN-ALLOY HAVING A HIGH BLOCKING TEMPERATURE

The present invention claims priority to Provisional Application Ser. No. 60/084,626, filed May 7, 1998 and entitled NIMN-BIASED SPIN VALVE/GMR WITH CO/RU/CO ARTIFICIAL ANTIFERROMAGNETIC PINNED LAYER.

BACKGROUND OF THE INVENTION

The present invention relates to data storage systems. More specifically, the present invention relates to data storage systems using read heads which utilize the giant magnetoresistive (GMR) effect.

Magnetic sensors utilizing the GMR effect, frequently referred to as "spin valve" sensors, are known in the art. A spin valve sensor is typically a sandwiched structure consisting of two ferromagnetic layers separated by a thin non-ferromagnetic layer. One of the ferromagnetic layers is called the "pinned layer" because it is magnetically pinned or oriented in a fixed and unchanging direction. Magnetic pinning of the pinned layer is frequently accomplished using an adjacent antiferromagnetic layer, commonly referred to as the "pinning layer," through exchange coupling. The pinned layer must be kept magnetically rigid at a device operating temperature, of about 150° C. in a disc drive where an excitation field as high as 300 Oe is applied to the sensor. The other ferromagnetic layer is called the "free" or "unpinned" layer because the magnetization is allowed to rotate in response to the presence of external magnetic fields. Spin valve/GMR sensors provide an output which is dependent upon angle variation of the magnetizations between the free and pinned layers.

One type of self pinned layer is known in the art as an artificial antiferromagnetic layer (AAF) or a synthetic antiferromagnetic layer (SAF). Such a SAF layer is formed by three sub-layers, a first ferromagnetic layer, a second ferromagnetic layer and a non-magnetic spacer layer separating the two ferromagnetic layers. The two ferromagnetic layers have magnetic vectors which are biased in antiparallel directions and in the plane of the sensor (perpendicular to the air bearing surface). This is described in, for example, U.S. Pat. No. 5,583,725, issued Dec. 10, 1996 to Coffey et al., entitled "SPIN VALVE MAGNETORESISTIVE SENSOR WITH SELF-PINNED LAMINATED LAYER AND MAGNETIC RECORDING SYSTEM USING THE SENSOR, which is incorporated herein by reference.

An Co/Ru/Co SAF layer has been used in combination with an NiO antiferromagnetic layer in a spin valve. See for example, R. E. Fontana, U.S. Pat. No. 5,701,223 entitled A SPIN VALVE MAGNETORESISTIVE SENSOR WITH ANTIPARALLEL PINNED LAYER AND IMPROVED EXCHANGE BIAS LAYER, AND MAGNETIC RECORDING SYSTEM USING THE SAME. An apparent purpose of combining the Co/Ru/Co SAF layer with the NiO antiferromagnetic layer was to reduce the demag field from the pinned layer in order to optimize the bias point of the sensor. An additional benefit was the enhancement of the pinning/switching field. However, the thermal relaxation in a NiO spin valve is severe due to the low blocking temperature (approximately 200° C.) and poor blocking temperature distribution. This spin valve structure lacks stability, and is therefore not ideal for a read sensor. FIG. 1 is a plot illustrating the temperature dependence of such a spin valve having an NiO antiferromagnetic layer and a SAF pinned layer. As can be seen in FIG. 1, this spin valve structure exhibits poor thermal stability. Further, the GMR transfer curves (plotting resistance of the sensor as a function of applied magnetic field) exhibit a permanent change after experiencing a thermal temperature ramp.

SUMMARY OF THE INVENTION

Disclosed are a spin valve magnetoresistive sensor and methods of fabricating the same. The sensor includes a free layer, a synthetic antiferromagnetic (SAF) layer, a spacer layer positioned between the free layer and the SAF layer, and a Mn-based antiferromagnetic pinning layer with a high blocking temperature in contact with the SAF layer. For example, a NiMn layer having a blocking temperature of approximately 400° C. or a PtMn layer having a blocking temperature of approximately 380° C. can be used. The SAF layer includes first and second ferromagnetic CoFe layers and an Ru spacer layer positioned between and directly in contact with the first and second CoFe ferromagnetic layers.

DETAILED DESCRIPTION OF THE PREFERRED EMBODIMENTS

Figure 1:
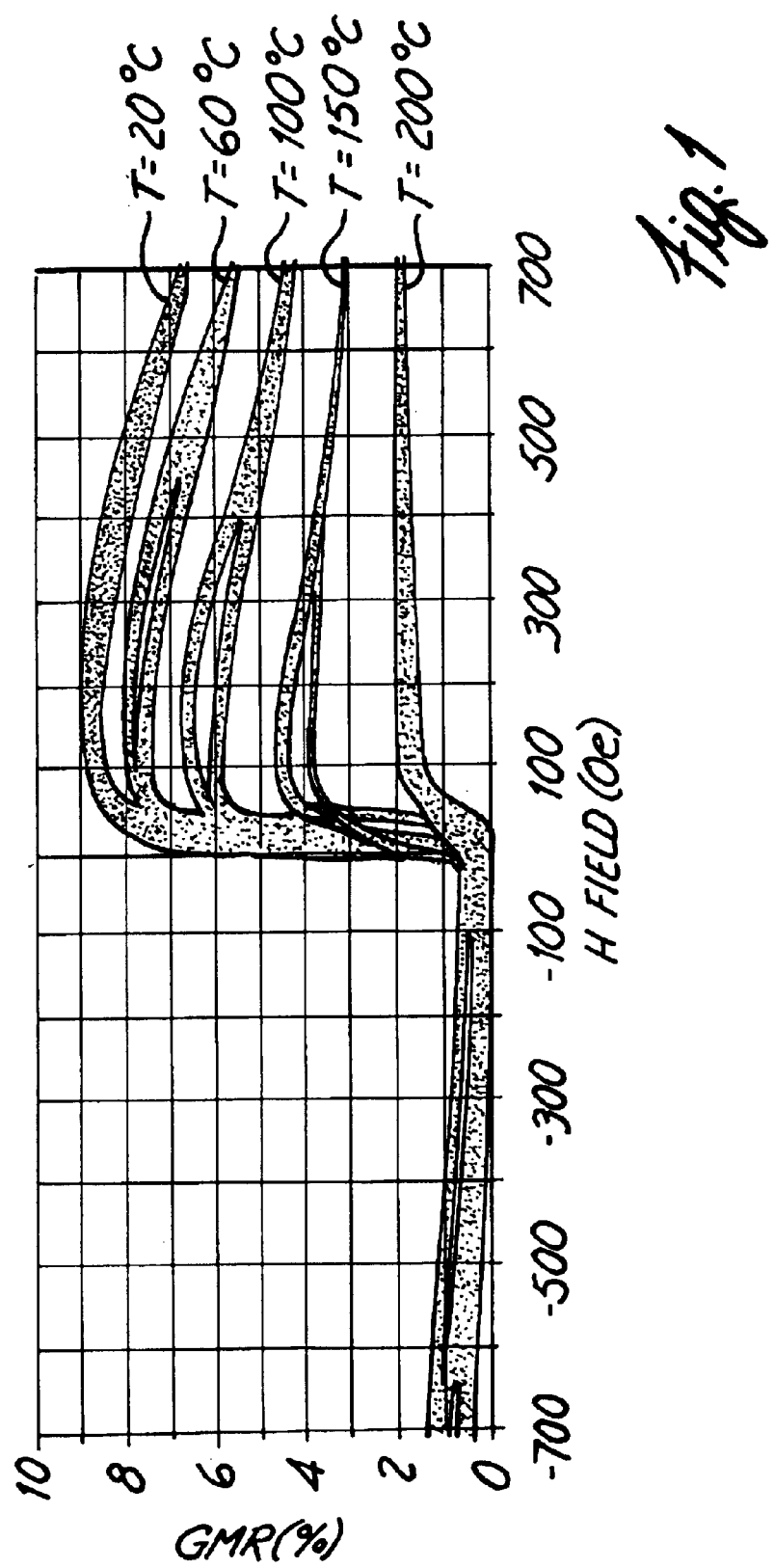
FIG. 1 is a plot illustrating the temperature dependence of a prior art spin valve having an NiO antiferromagnetic layer and a SAF pinned layer.
Figure 2:
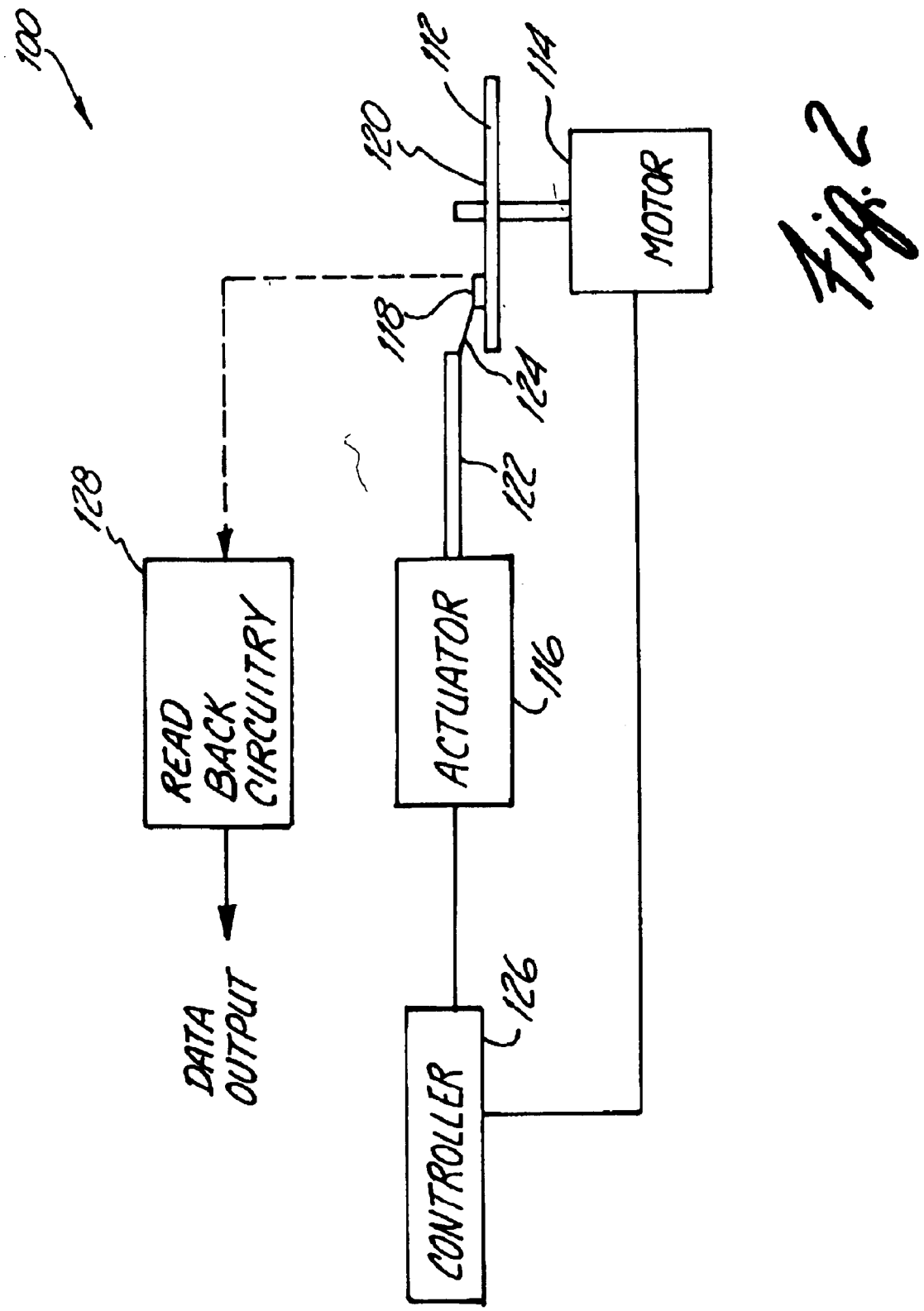
FIG. 2 is a simplified diagram of a storage system using a magnetoresistive sensor in accordance with the present invention.

The present invention includes a new giant magnetoresistive (GMR) spin valve sensor which may be used in a data storage system such as data storage system 100 shown in FIG. 2. System 100 includes storage medium 112 such as a magnetic disc which is rotated by motor 114. An actuator 116 is coupled to a slider 118 which is used to position a magnetoresistive sensor (not shown in FIG. 1) over a surface 120 of disc 112. Actuator 116 includes actuator arm 122 which is attached to slider 118 via suspension 124. A controller 126 controls positioning of slider 118. The magnetoresistive sensor operates by receiving a sense (or bias) current I from a current source on read back circuitry 128. Variations in a magnetic field applied to the magnetoresistive sensor due to magnetization of disc 112 cause a change in the electrical resistance of the sensor. This change in electrical resistance is detected with readback circuitry 128 which responsively provides data output. Operation of spin valves is known in the art and is described, for example, in U.S. Pat. No. 4,949,039, issued Aug. 14, 1990 to Grünberg, which is hereby incorporated by reference.

Figure 3:
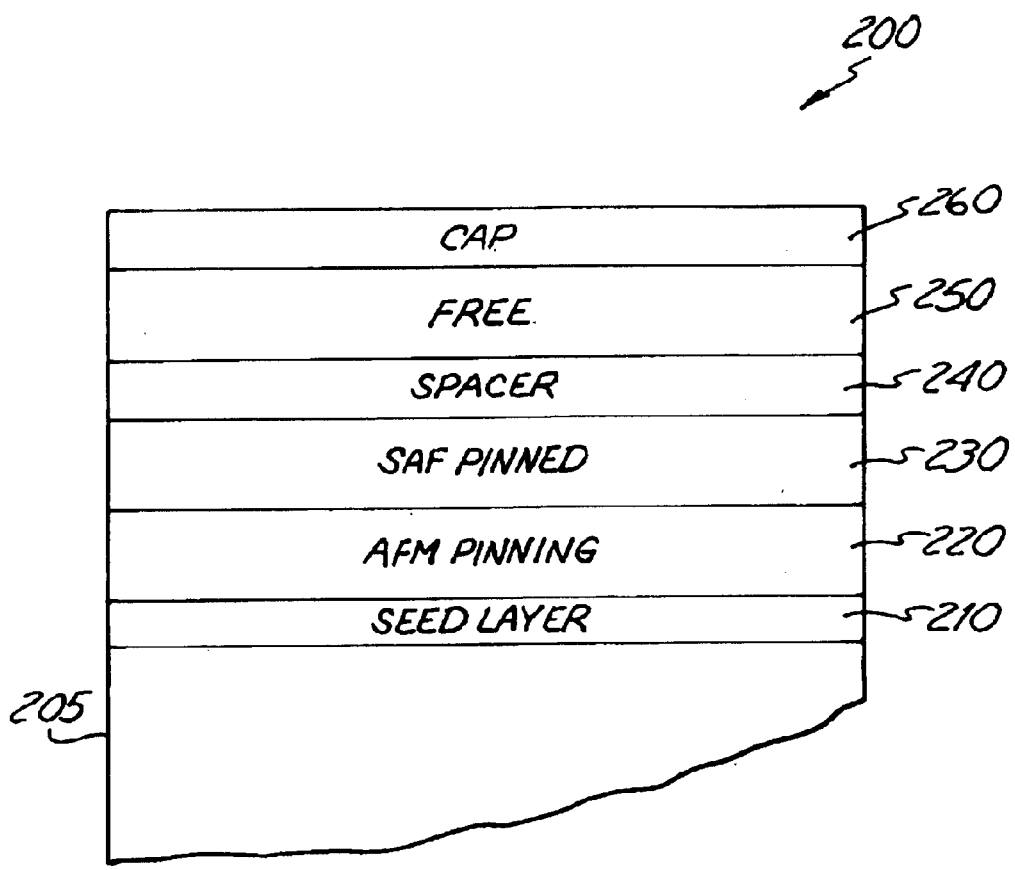
FIG. 3 is a simplified diagrammatic cross-sectional view of a portion of a giant magnetoresistive (GMR) or "spin valve" sensor in accordance with the present invention.
Figure 4:
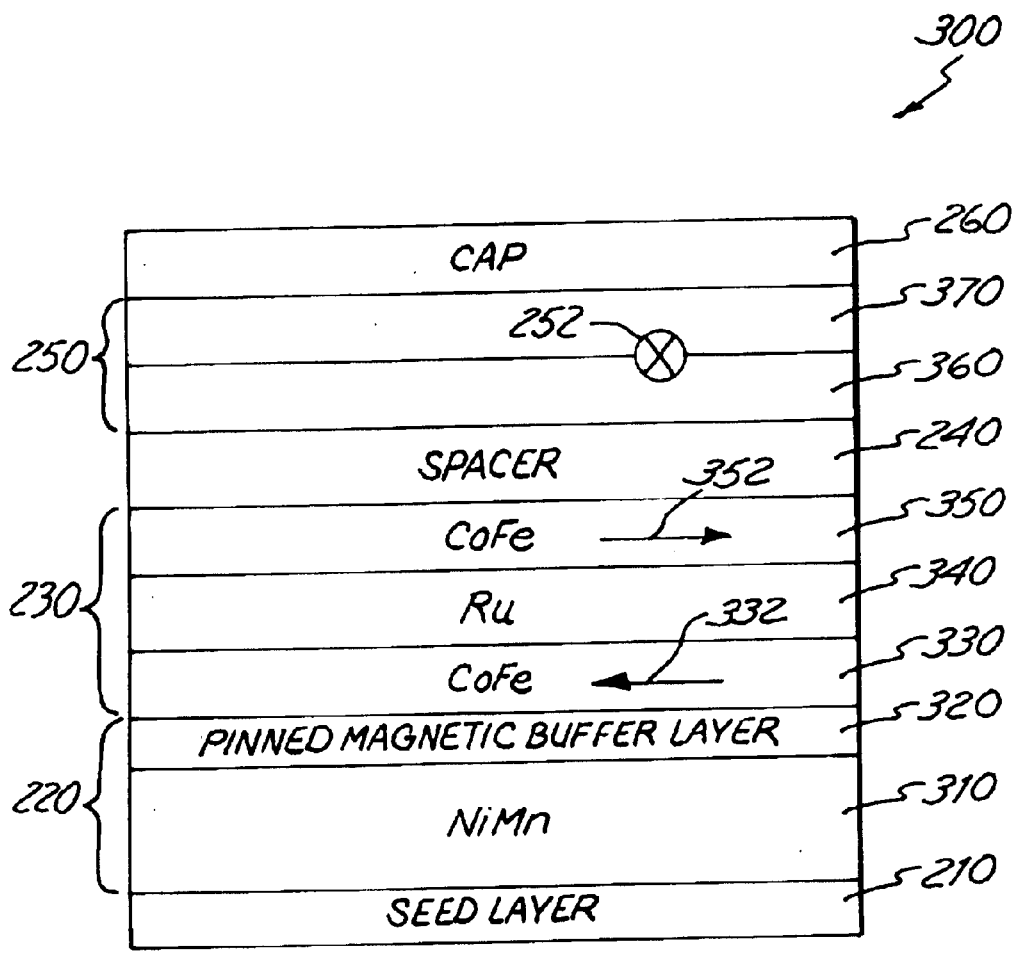
FIG. 4 is a simplified diagrammatic cross-sectional view of a portion of a GMR or spin valve sensor in accordance with a first more particular embodiment of the invention.
Figure 5:
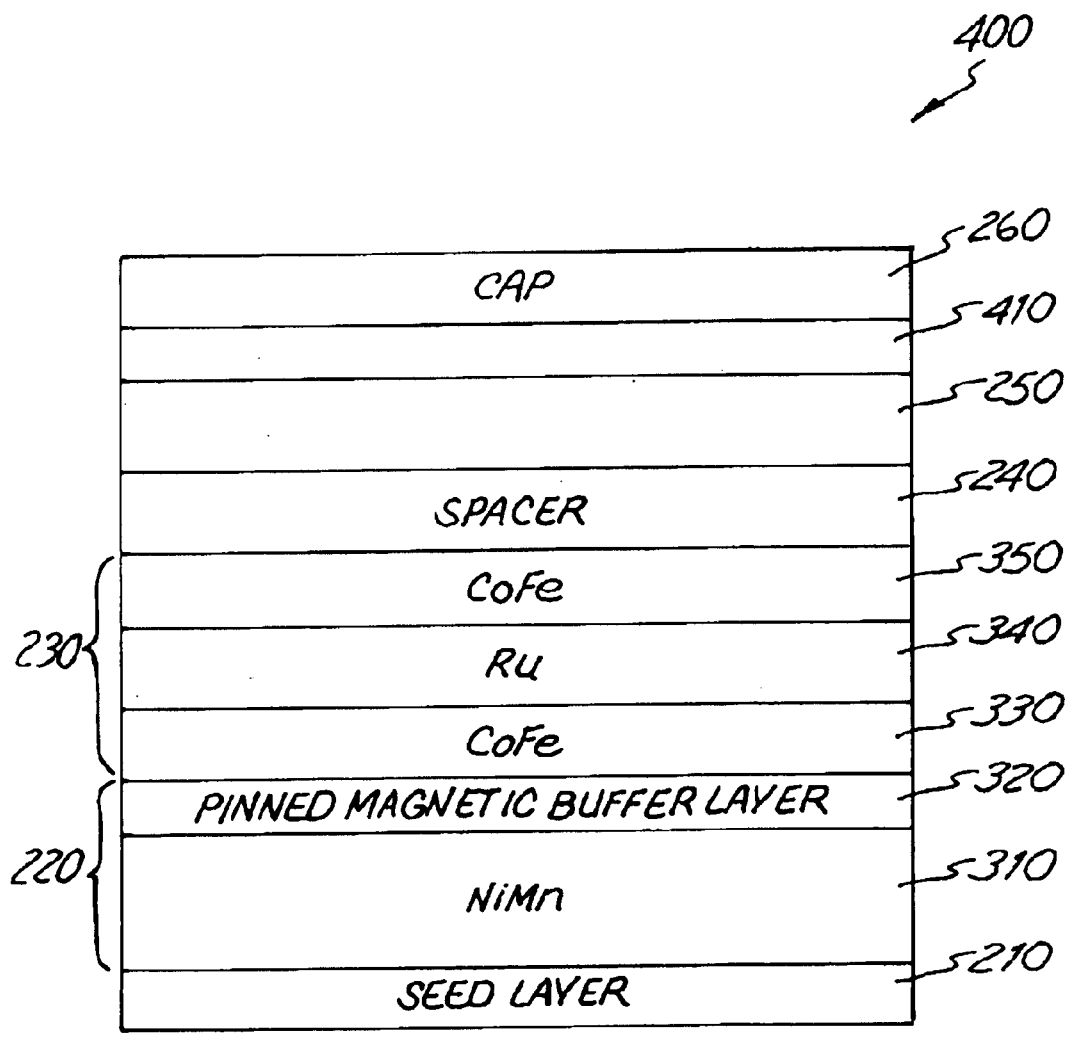
FIG. 5 is a simplified diagrammatic cross-sectional view of a portion of a GMR or spin valve sensor in accordance with a second more particular embodiment of the invention.

FIGS. 3–5 are cross sectional views of magnetoresistive sensors 200, 300 and 400 in accordance with the present invention. The sensors form a portion of air bearing surface 205 of the slider as shown in FIG. 3. The layers of sensor 200 lie in planes which are approximately perpendicular to the air bearing surface. Sensors 200, 300 and 400 are embodiments of sensors which can be included on slider 118. Sensor 200 illustrated in FIG. 3 includes seed layer 210, antiferromagnetic (AFM) pinning layer 220, synthetic antiferromagnetic (SAF) pinned layer 230, spacer layer 240, free or unpinned layer 250 and cap 260.

Seed layer 210 can be any of a wide variety of seed layer materials which are useful in achieving desired characteristics in AFM pinning layer 220. For example, for a preferred embodiment of the present invention in which AFM pinning layer 220 includes a layer of NiMn, seed layer 210 is preferably tantalum (Ta). However, other seed layer materials may be preferred for other AFM pinning layers 220. For example, seed layer 210 can be TaN, SiN, NiFeCr, NiFeRe, NiFeRh, NiFeNb and NiFeZr. Also, seed layer 210 can be a bi-layer seed layer. For example, seed layer 210 can be a bi-layer of Ta/NiFe or a bi-layer of NiFeCr/NiFe. Thickness of seed layer 210 are, in some embodiments, between 25 angstrom (Å) and 50 Å. A nominal thickness of seed layer 210 is 35 Å.

Pinning layer 220 is a manganese (Mn) based antiferromagnetic alloy. In preferred embodiments, pinning layer 220 includes a layer of NiMn. In these embodiments, the composition of the NiMn pinning layer 220 is preferably between about 45 and 65 atomic percent Mn. However, in other embodiments, instead of NiMn, pinning layer 220 includes a layer of PtMn or CrMnPt. As examples of characteristics of the Mn-based pinning layer 220, NiMn has a high blocking temperature of approximately 400° C., while PtMn has a high blocking temperature of approximately 380° C. Also, as described below with reference to a preferred fabrication method of present invention, pinning layer 220 is preferably a bi-layer including the Mn-based alloy layer 310 and a pinned magnetic buffer layer 320 which helps to link the AFM pinning layer to the rest of the stack of sensor 200. Layers 310 and 320 are shown in FIGS. 4 and 5. Further, the buffer layer allows thermal annealing of layers 230, 240, 250 and 260 to be avoided. In preferred embodiments, if AFM pinning layer 220 includes a layer 310 of NiMn, then the buffer layer 320 of AFM pinning layer 220 includes a layer of NiFe. In alternate embodiments, if AFM pinning layer 220 includes a layer of PtMn, then the buffer layer portion of AFM pinning layer 220 preferably includes a layer of CoFe. Generally, the Mn-based AFM portion of pinning layer 220 has a thickness of between about 80 Å and about 300 Å. The thickness of the buffer layer portion of AFM pinning layer 220 will preferably be between about 30 Å and about 60 Å.

Synthetic antiferromagnetic layer 230 is shown in greater detail in FIGS. 4 and 5. Layer 230, includes a first ferromagnetic layer 330, a second ferromagnetic layer 350 and a non-ferromagnetic layer 340 which separates layers 330 and 350. In the specific embodiments shown, layers 330 and 350 are CoFe layers having thicknesses between about 15 Å and about 35 Å and layer 340 is an Ru layer having a thickness of between about 7 and 12 Å. Synthetic antiferromagnetic layers are known in the art and are described, for example, in U.S. Pat. No. 5,583,725 to Coffey et al. which issued Dec. 10, 1996, entitled "SPIN VALVE MAGNETORESISTIVE SENSOR WITH SELF-PINNED LAMINATED LAYER AND MAGNETIC RECORDING SYSTEM USING THE SENSOR." Ferromagnetic layers 330 and 350 are coupled across non-magnetic layer 340 and have vectors 332 and 352 (shown in FIG. 4) aligned substantially antiparallel such that they are "self pinned." Synthetic antiferromagnetic layers can be used in conjunction with or in place of the separate pinning layer. In the present invention, CoFe/Ru/CoFe SAF layer 230 is used with AFM pinning layer 220 for enhanced thermal stability and performance.

Spacer layer 240 can be any of a wide variety of non-ferromagnetic materials. In a preferred embodiment, spacer layer 240 is Cu, which has low electrical resistively. In an exemplary embodiment spacer layer 240 is a layer of Cu having a thickness of about 33 Å. However, other non-ferromagnetic materials can be used for spacer layer 240, for example Ag, Au and CuX (where X is Ag, Ru or Rh, for example).

Free layer 250 is a ferromagnetic layer whose magnetization vector 252 (shown in FIG. 4) remains unpinned such that, in the presence of a magnetic field to the sensed, the magnetization of free layer 250 is caused to rotate. The GMR effect occurs when the magnetization of free layer 250 rotates such that it is at least partially antiparallel to the direction in which the magnetization of SAF pinned layer is pinned.

As illustrated in FIG. 4, unpinned or free ferromagnetic layer 250 can be a bi-layered structure having layer 360 of CoFe and layer 370 of NiFe. In this embodiment, layer 360 of CoFe is between 5 and 25 Å thick, while layer 370 of NiFe is between 5 and 60 Å thick. Layer 250 can also be other sub-layered materials such as Co/NiFe.

As illustrated in FIG. 5, soft magnetic layer 410 can be included on top of and directly in contact with free layer 250. Layer 410 should be magnetically softer than free layer 250, but have a resistivity which is high compared to the resistivity of free layer 250. Soft magnetic layer 410 can be, for example, a layer of CoZrNb, CoZrTa, FeSiAl, or NiFeX (where X is Cr, Re, Rh, or Nb for example).

Cap layer 260 protects other layers in sensor 200 from atmospheric damage. In preferred embodiments, oxide cap layer 260 should be used for electron specular scattering. This layer can be deposited oxygen plasma. However, in other embodiments, cap layer 260 is formed by allowing the top of free layer 250 to oxidize in the atmosphere.

An ex-situ fabrication process according to the present invention can be used to fabricate spin valves 200, 300 and 400 illustrated in FIGS. 3–5. Using the ex-situ fabrication process, seed layer 210 is first deposited using the materials and thicknesses described above. Next, without breaking vacuum, AFM pinning layer 220 is deposited. Preferably, deposition of AFM pinning layer 220 includes deposition of NiMn layer 310, followed by deposition of an NiFe buffer layer 320. However, in other embodiments, pinning layer 310 can be PtMn or CrMnPt. In these embodiments, buffer layer 320 can be another ferromagnetic material such as CoFe.

Layers 210 and 220 can be deposited using a variety of different physical vapor deposition (PVD) techniques including ion beam sputtering, DC/RF sputtering, and S-gun sputtering. For S-gun deposition, gas pressure is important for controlling the film crystallinity. It has been found that the pressure should be between 1 and 5 mTorr. Useful deposition rates are in the rage of 0.05 to 0.15 nm/second. The power used is in the range of 50 to 500W, depending upon the targets. The bias is between 0 and 60V. Preferably, the wafer is placed far away from the plasma.

For ion beam deposition, the energetics should be controlled to produce good microstructure and interfaces. The beam energy appears to be the most critical parameter. The preferred beam energy range is between 300 eV and 600 eV. Another important factor is the geometry between the incident ion beam, target, and wafer. The target should be placed in such a way that the reflected neutral is off the wafer. The wafer should be aligned with respect to the flux of sputtered materials in the range of 0 to 45 degrees. The preferred deposition rate is between 0.25 A/sec. and 2 A/sec. The ion beam sputtering deposition is performed in the presence of an inert gas, preferably at a low pressure of approximately $10^{-4}$ Torr. Deposition temperature does not appear to be important.

Another deposition method which can be used to form layers 210 and 220 to achieve a proper microstructure is planer DC/RF magnetron sputtering. For planer DC/RF magnetron sputtering, an important factor is to remove the wafer from the plasma to avoid the ion bombardment on the growing film surface. Then the film growth control should be similar to the S-gun deposition. The preferred deposition pressure range is believed to be 1 to 5 mTorr. The preferred deposition rates are between 0.05 to 0.15 nm/second. It is beneficial to apply a uniform magnetic field parallel to the air bearing surface of approximately 100 Oe during the film growth.

After deposition of layer 210 and sub-layers 310 and 320 of layer 220, the next step in the ex-situ process is to break vacuum and remove the stack from the deposition chamber for annealing. The stack is annealed at a temperature of between approximately 250–300° C. for at least about 2 hours. In preferred embodiments, the stack is annealed at less than 300° C. to avoid oxidation. The anneal can range in duration between 2 hours and 10 hours, and is preferably between 4 hours and 6 hours. The initial annealing is preferably performed in a magnetic field of at least 100 gauss. In the initial anneal, the applied magnetic field can be applied in a direction perpendicular to the direction of the magnetic field applied during deposition of the films. Thus, the magnetic field applied during annealing is perpendicular to the air bearing surface. The strength of the magnetic field used ultimately depends upon the shape of the sensor being fabricated. In general, higher annealing magnetic field strengths are preferred. The anneal is preferably performed in a partial vacuum with protective back-filled (flowing) gases, for example $N_2$ or Ar, at approximately 1 Torr.

The annealing process is necessary to cause the NiMn pinning layers to produce the high pinning field strengths desired. Prior to annealing, the NiMn pinning layers do not produce the necessary pinning fields. It is believed that the deposition techniques described above result in the production of fewer grain boundaries. This in turn is believed to provide the thermal stability which allows the spin valve sensor to be annealed under conditions which have proven destructive to prior art spin valve sensor designs.

If desired, the annealing step can include a cross-annealing cycle after the initial anneal. It is believed that a cross-anneal in a magnetic field of at least about 100 gauss, with magnetic field oriented in a direction perpendicular to the magnetic field used in the initial anneal, will help to enhance the desired magnetic configurations. However, cross-annealing is not required.

The appearance of pinning fields is associated with the phase transformation in the NiMn film as confirmed by X-ray diffractometry. Specifically, it is associated with the transformation from face-centered-cubic (fcc) γ phase to the anti-ferromagnetic fct θ phase. A pinning field of between 400 and 700 Oe is readily obtainable using the preferred method of the present invention.

After annealing to establish the AFM pinning field, the stack (including layer 210 and sub-layers 310 and 320 of layer 220) is again placed into a vacuum and the surface of buffer layer 320 is etched to remove a portion of the buffer layer. Typically, removal of approximately 30 to 40 Å of buffer layer 320 is preferred. Then, in a vacuum deposition chamber, sub-layers 330, 340 and 350 are sequentially deposited. Layers 330 and 350 of CoFe are antiferromagnetically coupled through Ru spacer layer 340. After deposition of SAF layer 230 (layers 330, 340 and 350), Cu spacer layer 240 and free layer 250 are deposited. As discussed above and shown in FIG. 4, free layer 250 can be, for example, CoFe/NiFe or Co/NiFe. Then, if desired, soft magnetic layer 410 is deposited. Each of layers 230, 240, 250 and 410, including sub-layers, should be deposited without breaking vacuum. Deposition of these layers can be accomplished using S-gun deposition, ion-beam sputtering, or DC/RF sputtering. In a preferred embodiment of the present invention, layers 230, 240, 250 and 410 are deposited using DC sputtering. After deposition of layers 230, 240, 250 and 410, cap layer 260 is preferably deposited using oxygen plasma. In the alternative, the top sub-layer of free layer 250 (i.e., layer 370 in FIG. 4 or layer 410 in FIG. 5) can be allowed to oxidize under atmospheric conditions. Generally, deposition of oxygen plasma in a vacuum is the preferred method of obtaining cap 260.

The spin valve sensors of the present invention can also be deposited in-situ (without breaking vacuum). In these fabrication method embodiments, the layers and sub-layers of the sensor are all deposited sequentially without breaking vacuum. In these embodiments, buffer layer 320 can be omitted. After all of the layers (including layers 230, 240, 250, 410 and 260) have been deposited, the entire stack is annealed. Generally, the ex-situ method described previously has provided better results than the in-situ method.

Figure 6:
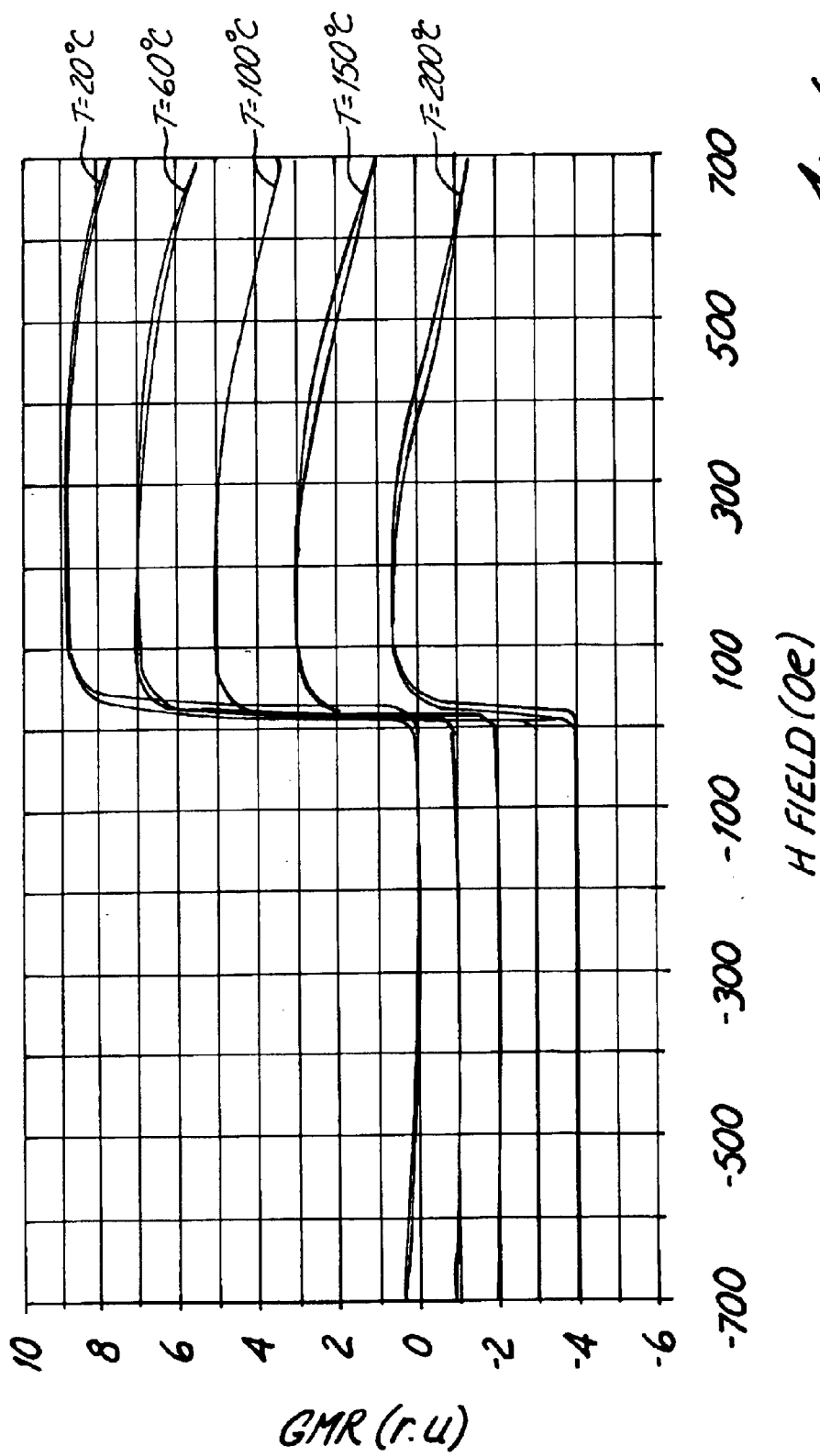
FIG. 6 is a plot illustrating the GMR effect as a function of applied magnetic field, over a range of operating temperatures, for a spin valve sensor of the present invention having a NiMn pinning layer.
Figure 7:
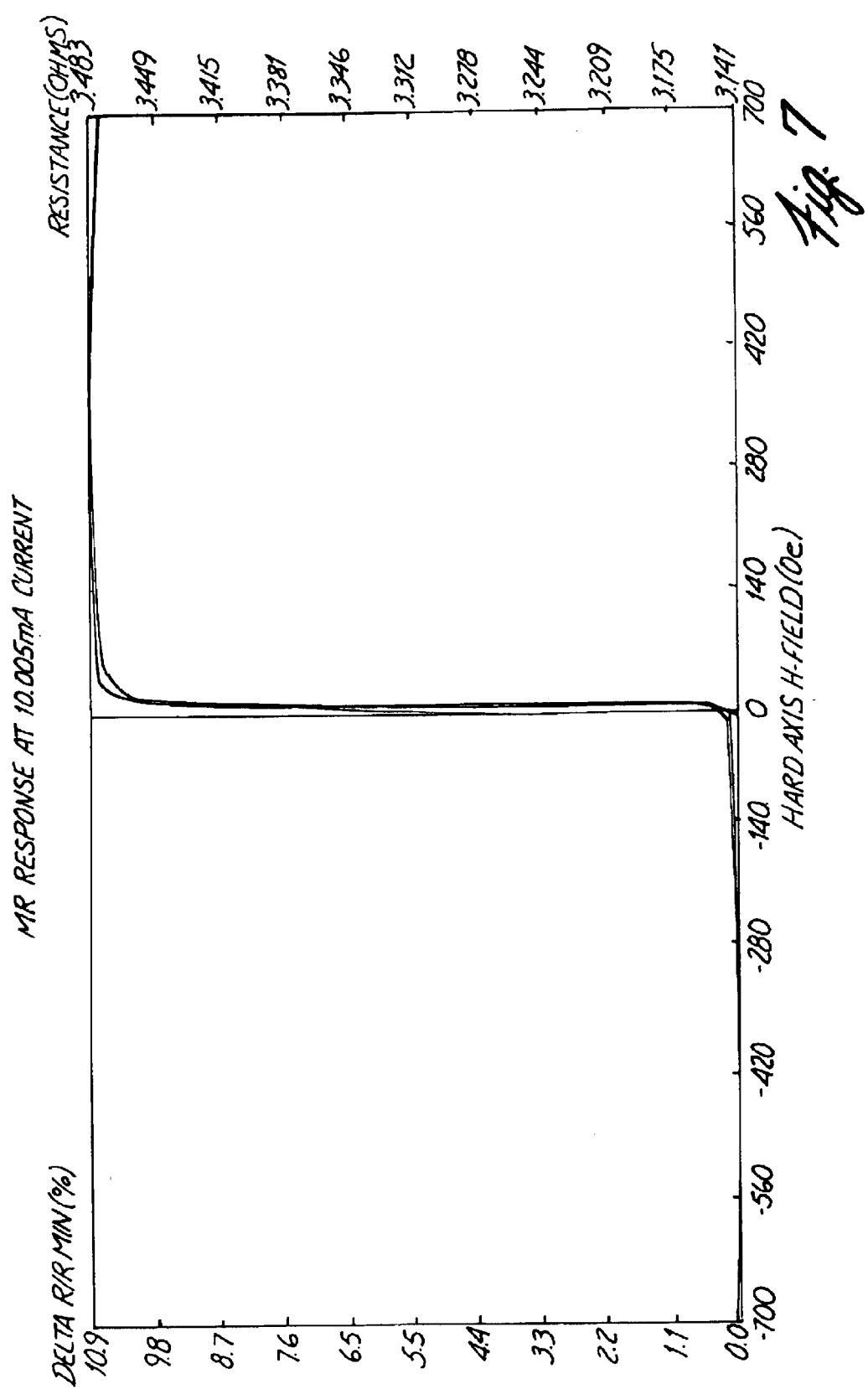
FIG. 7 is a plot illustrating the GMR effect as a function of applied magnetic field for a spin valve sensor of the present invention having a PtMn pinning layer.

FIG. 6 is a plot illustrating GMR effect (percent change) as a function of applied magnetic field over a range of temperatures for a NiMn pinned sensor fabricated using the ex-situ methods described below. The sensor uses a CoFe/Ru/CoFe SAF layer 220. The curves for each of the temperatures have been offset by 2 percent GMR for the sake of clarity in FIG. 6. At 300 Oe, a nine percent GMR effect was achieved, with an absolute resistance change of 1.2 ohms/square. The switching field of the pinned layer, which is a measure of magnetic stability represented by the minimum magnetic field necessary to move the pinned layer's magnetization, is above 700 Oe for the sensor. Further, the switching field does not vary significantly over temperature, remaining above 700 Oe from room temperature to around 200° C. Additionally, the sensor is very stable thermally. Also, the patterned sensor with the CoFe/Ru/CoFe SAF pinned layer showed improved linear response due to the lack of highly non-uniform demag field present in many conventional pinned layers. FIG. 7 is a plot illustrating the GMR effect as a function of applied magnetic field for a PtMn pinned sensor. It can be seen in FIG. 7 that the ex-situ methods of the present invention result in a high GMR effect for PtMn pinned sensors as well.

Although the present invention has been described with reference to preferred embodiments, workers skilled in the art will recognize that changes may be made in form and detail without departing from the spirit and scope of the invention.

What is claimed is:

1. A spin valve magnetoresistive sensor, comprising:
   a free layer having a magnetization which changes in the presence of a magnetic field;
   a synthetic antiferromagnet layer, comprising:
      a first ferromagnetic layer comprising a layer of CoFe;
      a second ferromagnetic layer comprising a layer of CoFe; and
      a first spacer layer of nonmagnetic material positioned between and directly in contact with the first and, second ferromagnetic layers, the first spacer layer comprising a layer of Ru;
   a second spacer layer positioned between and directly in contact with the first ferromagnetic layer of the synthetic antiferromagnetic layer and the free layer; and
   an antiferromagnetic layer comprising:
      a buffer layer positioned directly in contact with the second ferromagnetic layer of the synthetic antiferromagnetic layer, the buffer layer selected from the group consisting of NiFe and CoFe; and
      an Mn-alloy layer positioned directly in contact with the buffer layer.

2. The spin valve magnetoresistive sensor of claim 1, wherein the Mn-alloy layer of the antiferromagnetic layer comprises a NiMn.

3. The spin valve of claim 1, wherein the free layer comprises:
   a third ferromagnetic layer positioned in contact with the second spacer layer; and
   a fourth ferromagnetic layer positioned in contact with the third ferromagnetic layer.

4. The spin valve of claim 3, wherein the fourth ferromagnetic layer comprises NiFe.

5. The spin valve of claim 4, wherein the third ferromagnetic layer comprises CoFe.

6. The spin valve of claim 4, wherein the third ferromagnetic layer comprises Co.

7. The spin valve of claim 1, wherein the Mn-alloy layer of the antiferromagnetic layer comprises CrPtMn.

8. The spin valve of claim 1, wherein the Mn-alloy layer of the antiferromagnetic layer comprises PtMn.

9. The spin valve of claim 1, wherein the Mn-alloy layer of the antiferromagnetic layer comprises PdPtMn.

10. The spin valve of claim 1, wherein the Mn-alloy layer of the antiferromagnetic layer comprises IrMn.

11. A storage system for storing information, comprising:
    a storage medium;
    means for reading information from the storage medium, the means for reading including a spin valve sensor having a synthetic antiferromagnetic layer, a Mn-based antiferromagnetic layer, and a buffer layer positioned between the synthetic antiferromagnetic layer and the Mn-based antiferromagnetic layer.

* * * * *

UNITED STATES PATENT AND TRADEMARK OFFICE
CERTIFICATE OF CORRECTION

PATENT NO. : 6,738,236 B1
DATED : May 18, 2004
INVENTOR(S) : Sining Mao et al.

It is certified that error appears in the above-identified patent and that said Letters Patent is hereby corrected as shown below:

Column 7,
Line 10, delete "," after "and".

Signed and Sealed this

Twentieth Day of July, 2004

JON W. DUDAS
*Acting Director of the United States Patent and Trademark Office*